United States Patent [19]

Endo et al.

[11] Patent Number: 5,136,363
[45] Date of Patent: Aug. 4, 1992

[54] SEMICONDUCTOR DEVICE WITH BUMP ELECTRODE

[75] Inventors: Takashi Endo; Hirokazu Ezawa, both of Tokyo, Japan

[73] Assignee: Kabushiki Kaisha Toshiba, Kawasaki, Japan

[21] Appl. No.: 617,380

[22] Filed: Nov. 26, 1990

Related U.S. Application Data

[63] Continuation of Ser. No. 260,042, Oct. 20, 1988, abandoned.

[30] Foreign Application Priority Data

Oct. 21, 1987 [JP] Japan ............... 62-265961

[51] Int. Cl.⁵ ............ H01L 23/48; H01L 29/40; H01L 29/44
[52] U.S. Cl. ................. 357/71; 357/65; 357/68
[58] Field of Search .......... 357/71, 68, 65, 15, 357/67 S, 67; 437/183, 192, 200, 201

[56] References Cited

U.S. PATENT DOCUMENTS

| 4,087,314 | 5/1978 | George et al. | 156/643 |
| 4,258,382 | 3/1981 | Harris | 357/71 |
| 4,316,200 | 2/1982 | Ames et al. | 357/65 |
| 4,742,023 | 5/1988 | Hasegawa | 357/71 R |
| 4,970,571 | 11/1990 | Yamakawa et al. | 357/71 |

FOREIGN PATENT DOCUMENTS

| 2457484 | 5/1974 | European Pat. Off. | 357/67 S |
| 0036500 | 9/1981 | European Pat. Off. | 357/15 |
| 0182088 | 5/1986 | European Pat. Off. | 357/15 |
| 0045969 | 4/1978 | Japan | 357/15 |
| 58-28857 | 2/1983 | Japan | 357/71 |
| 59-181577 | 10/1984 | Japan . | |
| 60-41235 | 3/1985 | Japan . | |

OTHER PUBLICATIONS

27th Electronic Components Conference, Arlington, 16th-18th May 1987, pp. 130-134, A. S. Rose et al., "Metallurgical Considerations for Beam Tape Assembly".

Primary Examiner—William D. Larkins
Assistant Examiner—Carl Whitehead, Jr.
Attorney, Agent, or Firm—Foley & Lardner

[57] ABSTRACT

A semiconductor device having a bump electrode on a semiconductor substrate above an electrode pad and metal film. The shape of the bump electrode is composed of a cubical portion and a skirt extending outward from the bottom of the cubical portion. In manufacturing such a semiconductor device, a dry film is used which is laminated on the metal film under a certain laminating condition and formed with an opening. A bump material is formed as a deposit on the metal film within the opening, through electrolytic plating. The deposit has the cubical portion corresponding in shape to the opening, and the skirt extending outward into a space between the dry film and the metal film, from the bottom of the cubical portion. The metal film is etched out using the deposit as a mask to make the deposit as a bump electrode of the semiconductor device.

7 Claims, 3 Drawing Sheets

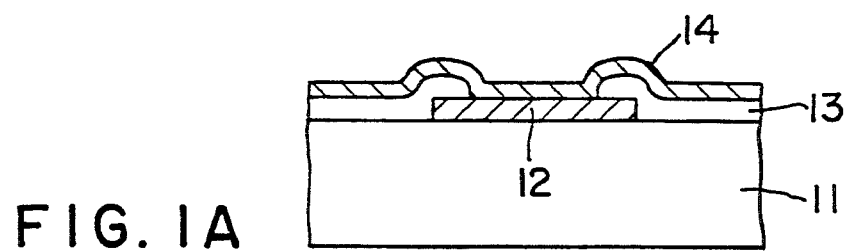
F I G. IA
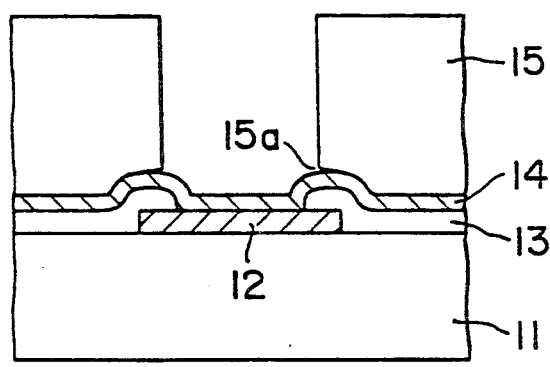
F I G. IB
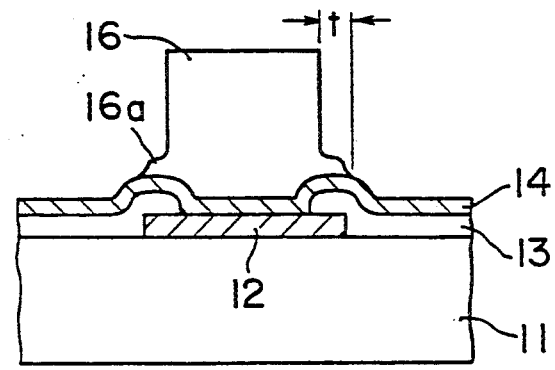
F I G. IC
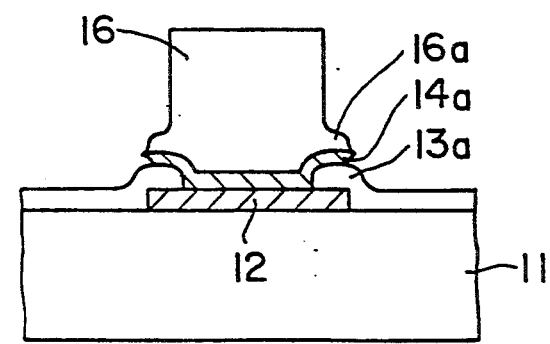
F I G. ID

SEMICONDUCTOR DEVICE WITH BUMP ELECTRODE

This application is a continuation of application Ser. No. 07/260,042, filed Oct. 20, 1988 now abandoned.

BACKGROUND OF THE INVENTION

1. Field of the Art

The present invention relates to a semiconductor device with bump electrodes, and more particularly to a semiconductor device with bump electrodes formed on electrode pads.

2. Prior Art

A conventional bump structure of a semiconductor device and a method of forming a bump will be described with reference to FIGS. 5A to 5D.

Referring to FIG. 5A, a semiconductor substrate 21 with impurities diffused and an $SiO_2$ film formed on the surface thereof (the impurity diffused region and the film are not shown) is formed thereon with an Al electrode pad 22. An insulating passivation film ($Si_3N_4$ film) 23 with an opening formed at the position above the Al electrode pad 22 is deposited on the semiconductor substrate 21 and on a part of the electrode pad 22. A metal film 24 as barrier metal layer is deposited on the $Si_3N_4$ film 23 and electrode pad 22 by means of the vapor deposition method or the sputtering method.

Next, as shown in FIG. 5B, a photopolymerized high polymer dry film 25 is pressure-laminated on the metal film 24 with a hot laminator under the conditions of 105° C. roll temperature, 0.2 m/min roll feed speed, and 20 $Kg/cm^2$ roll pressure. The dry film 25 is subjected to patterning to form an opening with a size corresponding to a desired bump side length, at the position only above the electrode pad 22. Thereafter, the patterned dry film 25 is baked at 100° C. for 10 minutes.

Next, by using the patterned dry film 25 as a plating mask, and the metal film 24 as one (a cathode) of the electrodes (cathode) in electrolytic plating, Au is selectively plated only within the opening of the dry film 25.

After removing the dry film 25, a rectangular Au deposit 26 is obtained on the metal film 24 above the electrode pad 22, as shown in FIG. 5C. Thereafter, as shown in FIG. 5D, by using the Au deposit 26 as a mask, the metal film 24 except that above the electrode pad is etched out. Thus, a semiconductor device with the rectangular Au bump 26 of a conventional structure formed on the metal film 24 above the Al electrode pad 22 is obtained.

Instead of the dry film, a liquid resist film may be used as a plating mask. However, in this case, it is difficult to deposit a plating mask thicker than the height of an Au bump which is 20 to 30 μm. As a result, an Au bump necessarily has a mushroom shape. In contrast, by using a dry film it becomes possible to obtain a plating mask of 20 to 40 μm thicker than the height of an Au bump, so that an Au bump can have a rectangular shape. Thus, it is advantageous that a relatively larger number of Au bumps per unit can be formed on the semiconductor substrate.

With the conventional method using a dry film, however, a portion 24a of the metal film 24 under the Au bump 26 is generally etched inward by about 5 μm in the etching process of the metal film 24, using the Au bump as a mask. Consequently, the peel strength of the Au bump 26 is as low as 30 to 40 g/pad (with the area of the electrode pad being 110 × 110 $μm^2$, and the area of the opening being 80 × 80 $μm^2$). In order to obtain a sufficient peel strength, it becomes necessary to enlarge the dimension of the Au bump, which prevents full use of the advantages of the method using a dry film.

Further, since the metal film 24 is etched inward by about 5 μm, the peripheral portion of the Al electrode pad 22 is covered with only the $Si_3N_4$ film 23a. As a result, the corrosion resistance of the Al electrode pad is lowered so that the reliability becomes degraded.

SUMMARY OF THE INVENTION

It is an object of the present invention to increase the peel strength of a bump electrode which is formed above an electrode pad of a semiconductor device so as to use it as an input/output electrode of the semiconductor device, and to improve the corrosion resistance at the peripheral portion of the electrode pad, thus facilitating Tape Automated Bonding (TAB) assembly and improving the reliability.

According to the present invention, the structure of a bump electrode to be used as an input/output electrode of a semiconductor device has a skirt at the lower end portion of the rectangular bump electrode, in contrast with the simple rectangular or mushroom shape of a conventional bump electrode. As illustrated in the drawings, the rectangular bump electrode has a main portion with substantially vertical side walls.

Since the bump electrode (made of Au in most cases) of this invention has a skirt extending outward in contact with the metal film, the contact area of the bump electrode with the metal film does not become small even under excessive etching of the metal film as described previously with respect to a bump electrode with a simple cubical shape. Further, the dimension of the bump electrode is not required to be unnecessarily large in order to ensure a sufficient contact area of the bump electrode with the metal film.

According to the semiconductor device of this invention, the bump electrode has a skirt so that excessive etching of the metal film under the bump electrode is avoided during the manufacturing process, thus considerably increasing the peel strength of the bump electrode. The bump structure according to this invention can be realized readily by changing the conditions of laminating a dry film, without unnecessarily increasing the quantity of Au, for example, and with effective assistance to the high density assembly technique for semiconductor devices.

Further, according to the semiconductor device of this invention, the electrode pad and adjacent portion thereof are covered with the skirt of a bump electrode. Therefore, the semiconductor device is protected from corrosion or other adverse effects caused by pin holes or cracks in the insulating passivation film, thus improving the reliability of the semiconductor device.

BRIEF DESCRIPTION OF THE DRAWINGS

FIGS. 1A to 1D are cross sections illustrating an embodiment of a method of manufacturing a semiconductor device according to the present invention;

DETAILED DESCRIPTION OF THE PREFERRED EMBODIMENT

Figure 2:
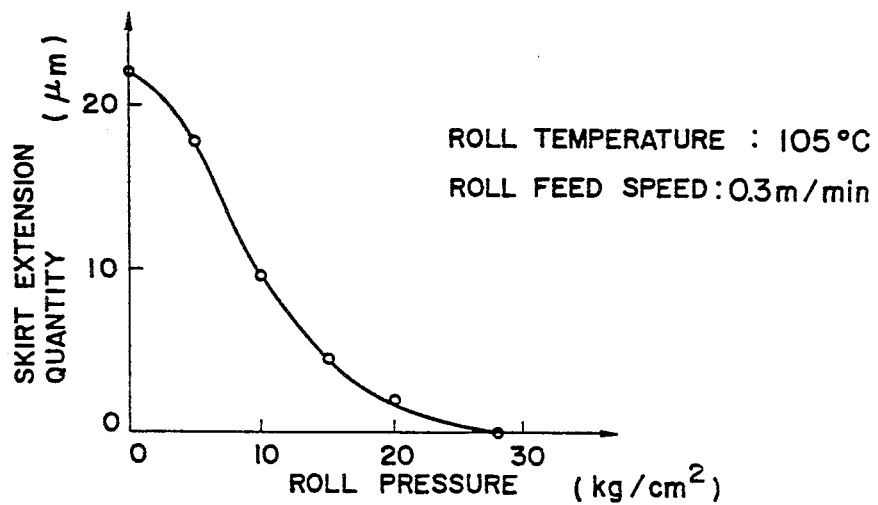
FIGS. 2 to 4 are graphs for explaining the advantageous effects of a semiconductor device of this invention.

FIG. 1D is a cross section showing an embodiment of a semiconductor device according to the present invention. The peripheral portion of an electrode pad 12 is covered with an insulating passivation film 13a. A bump electrode 16 with a skirt 16a is formed on a metal film 14a and the electrode pad 12, with the skirt 16a being extended over the insulating passivation film 13a at the peripheral portion of the electrode pad 12.

FIGS. 1A to 1D show the manufacturing steps of the bump electrode having the structure according to this invention. Referring to FIG. 1A, on a semiconductor substrate 11 with circuit elements such as transistors, diodes or the like, an electrode pad 12 is selectively formed, the pad having an area of $110 \times 110$ $\mu m^2$. The area of the electrode pad may take a value from (40 to 150) $\times$ (40 to 150) $\mu m^2$. The electrode pad 12 is made of a metal whose main component is Al. The insulating passivation film 13 made of $Si_3N_4$, is deposited over the entire surface of the Al electrode pad 12 and the semiconductor substrate 11. An opening is formed in the insulating passivation film 13 using the photolithography technique, at the position above the Al electrode pad 12. The insulating passivation film 13 serves as the passivation film for circuit elements formed on the semiconductor substrate 11. Next, the bump electrode to be connected to the electrode pad 12 and used as a signal input/output electrode is formed. In particular, as shown in FIG. 1A, first a metal film 14, e.g., a three-layered metal film composed of Ti, Ni and Pd in this order from lower to upper layers, is deposited on the exposed portion of the electrode pad 12 within the opening and on the insulating passivation film 13, through the sputtering method or the vapor deposition method. Instead of the above three-layered metal film, the metal film 14 may use a two-layered metal film of WSi and Pd, a three-layered metal film of WSi, Ni and Pd, a three-layered metal film of W, Ni and Pd, or a two-layered metal film of W and Pd, respectively in this order from lower to upper layers.

Next, as shown in FIG. 1B, a dry film 15 of 20 $\mu m$ thickness is laminated on the semiconductor device using a hot laminator under the conditions to be described later in detail. An opening is formed in the dry film 15 using the photolithography technique, with the peripheral portion 15a of the dry film 15 being arranged so that it is not in tight contact with the metal film 14.

Thereafter, as shown in FIG. 1C, by using the metal film 14 as one of the electrodes in electrolytic plating, Au is plated selectively on the metal film 14 only above the electrode pad 12. After the dry film 15 is removed, an Au deposit (bump electrode) 16 is obtained which has a skirt 16a extending outward by an amount of t-$\mu m$ as shown in FIG. 1C, the skirt 16a having extended outward and being relatively thicker, into the space formed at the peripheral portion 15a of the dry film 15 not in tight contact with the insulating passivation film 14.

Next, as shown in FIG. 1D, by using the Au deposit 16 as a mask, the metal film 14 except that portion above the electrode pad 12 is removed to thereby make the Au deposit 16 as an Au bump 16.

Figure 3:
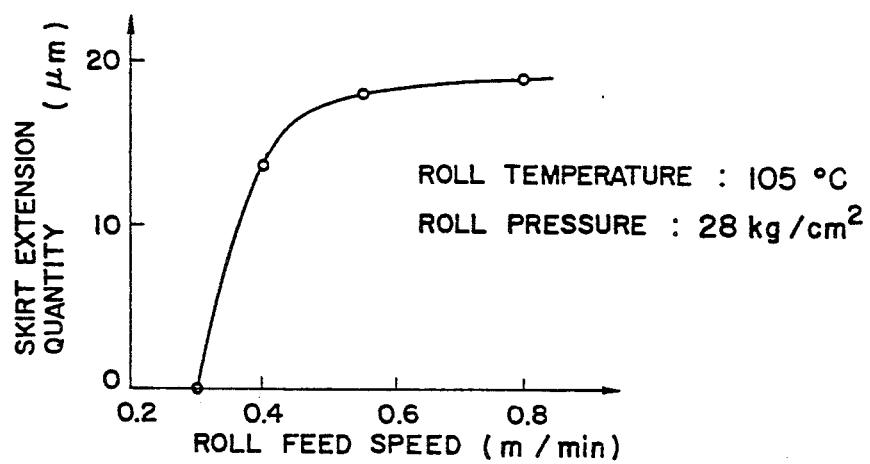

The relationship between the conditions of laminating a dry film at the process shown in FIG. 1B and the skirt extension quantity of an Au bump at the process shown in FIG. 1C is shown in FIGS. 2 and 3. FIG. 2 shows the relationship between a roll pressure and a skirt extension quantity with constant values of 105° C. roll temperature and 0.3 m/minute roll feed speed, and with variable 0 to 28 $Kg/cm^2$ roll pressure. FIG. 3 shows the relationship between a roll feed speed and a skirt extension quantity with constant values of 105° C. roll temperature and 28 $Kg/cm^2$ roll pressure, and variable 0.3 to 0.8 m/minute roll feed speed.

As seen from FIGS. 2 and 3, as the roll pressure is made small or the roll feed speed is made high, the skirt extension quantity can be made equal to or more than 1 $\mu m$. Alternatively, all the values of the roll temperature, roll pressure and roll feed speed may be set as desired to adjust the skirt extension quantity.

Figure 4:
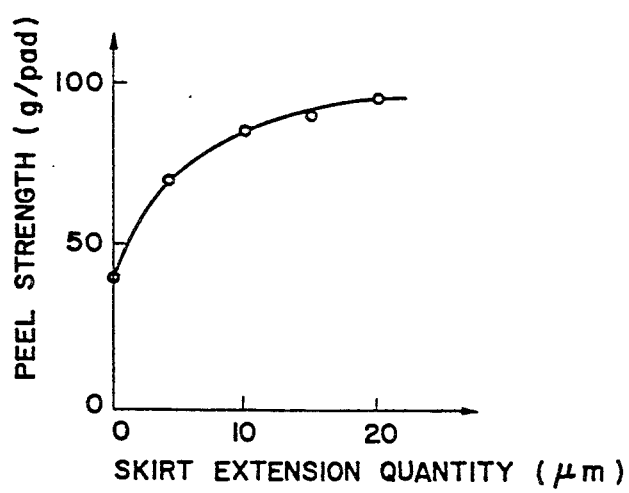
Figure 5A:
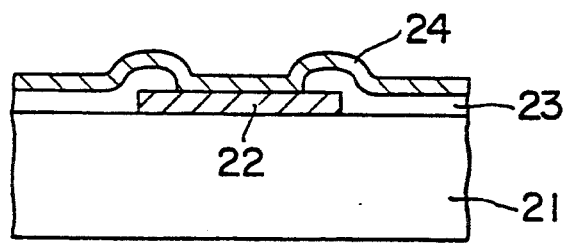
FIGS. 5A to 5D are cross sections illustrating a conventional method of manufacturing a semiconductor device.
Figure 5B:
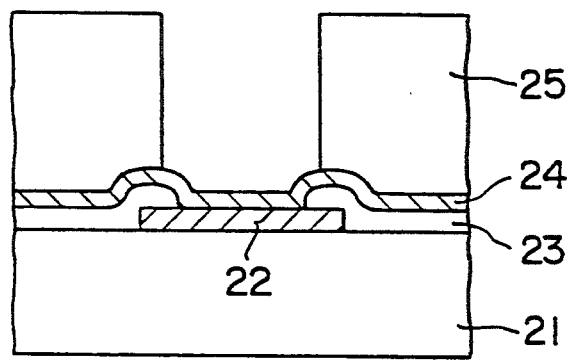
Figure 5C:
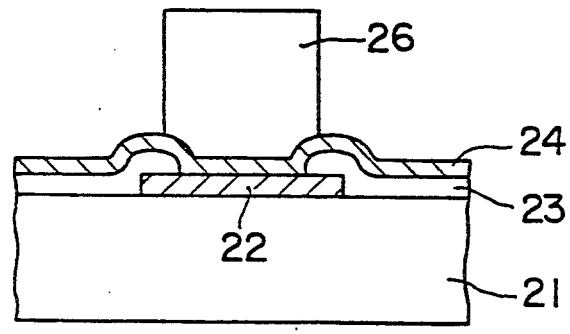
Figure 5D:
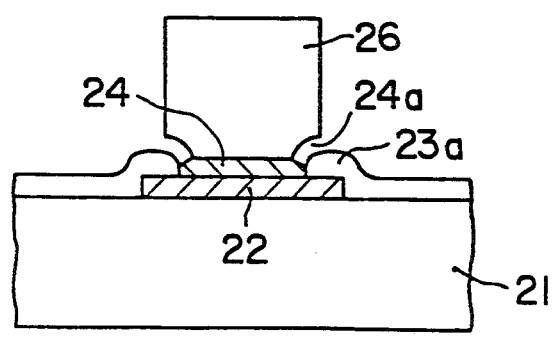

The relationship between the skirt extension quantity ($\mu m$) and the peel strength (g/pad) of an Au bump is shown in FIG. 4. As seen from FIG. 4, the peel strength of the Au bump having the skirt extension quantity of 0 is 30 to 40 g/pad. In contrast, the peel strength sharply increases as the skirt extension quantity becomes equal to 1 $\mu m$ or more, gradually increases as it reaches 2 to 5 $\mu m$, and saturates as it becomes equal to 10 $\mu m$ or more.

It was also confirmed that it was possible to prevent corrosion caused by pin holes or cracks in the insulating passivation film, because of the presence of the skirt which extends outward from the Au bump.

What is claimed is:

1. A semiconductor device comprising
   a semiconductor substrate formed with a circuit element;
   an electrode pad formed directly on said semiconductor substrate, no intermediate member being interposed between the substrate and the pad;
   an insulating passivation film having a contact hole exposing said pad, said insulating passivation film being formed on said substrate and on the peripheral portion of said pad;
   a metal film formed on said electrode pad at the exposed portion within said contact hole, and on said insulating passivation film at the peripheral portion of said contact hole; and
   a bump electrode formed on said metal film, said bump electrode including a skirt extending over the peripheral portion of said metal film and further including a main portion atop the central portion of said metal film, said main portion having substantially vertical sides, said skirt protruding outwardly form the substantially vertical sides of said main portion at the portion of the bump electrode adjacent the substrate and having a shape formed by a bump electrode material deposited on or extending into a gap between two film layers to form an electrode
   said skirt and said metal film being of substantially the same lateral length, said skirt contacting said metal film, with only said metal film interposed between said skirt and said insulating passivation film;
   wherein said metal film is obtained by forming a primary metal film on the electrode pad exposed within the contact hole and on the insulating passivation film, forming the bump electrode on the primary metal film, and etching the primary metal film using the bump electrode as a mask.

2. A semiconductor device according to claim 1, wherein the area of said electrode pad is (40 to 150) $\times$ (40 to 150) $\mu m^2$, and said skirt of said bump electrode extends outwardly of said main portion by an amount at least equal to or greater than 1 μm.

3. A semiconductor device according to claim 1, wherein said electrode pad is made of a metal whose main component is Al, said bump electrode is made of Au, said insulating passivation film is made of $Si_3N_4$, and said metal film is made of a three-layered metal film composed of Ti, Ni, and Pd, in this order, form its lower to upper layers.

4. A semiconductor device according to claim 1, wherein said electrode pad is made of a metal whose main component is Al, said bump electrode is made of Au, said insulating passivation film is made of $Si_3N_4$, and said metal film is made of a two-layered metal film composed of WSi and Pd, in this order, from its lower to upper layers.

5. A semiconductor device according to claim 1, wherein said electrode pad is made of a metal whose main component is Al, said bump electrode is made of Au, said insulating passivation film is made of $Si_3N_4$, and said metal film is made of a two-layered metal film composed of WSi, Ni and Pd in this order from its lower to upper layers.

6. A semiconductor device according to claim 1, wherein said electrode pad is made of a metal whose main component is Al, said bump electrode is made of Au, said insulating passivation film is made of $Si_3N_4$, and said metal film is made of a three-layered metal film composed of W, Ni and Pd in this order from its lower to upper layers.

7. A semiconductor device according to claim 1, wherein said electrode pad is made of a metal whose main component is made of a two-layered metal film composed of W and Pd in this order from its lower to upper layers.

* * * * *